United States Patent [19]

Dijkhof

[11] Patent Number: 5,349,613
[45] Date of Patent: Sep. 20, 1994

[54] DIGITAL PHASE LOCKED LOOP, AND DIGITAL OSCILLATOR ARRANGED TO BE USED IN THE DIGITAL PHASE LOCKED LOOP

[75] Inventor: Antonie Dijkhof, Eemnes, Netherlands

[73] Assignee: U.S. Philips Corporation, New York, N.Y.

[21] Appl. No.: 876,847

[22] Filed: Apr. 30, 1992

[30] Foreign Application Priority Data

May 8, 1991 [NL] Netherlands ............... 91201105

[51] Int. Cl.[5] .................................... H03D 3/24
[52] U.S. Cl. ............................. 375/120; 375/118
[58] Field of Search .................... 375/118, 119, 120; 331/12, 18, 25; 329/318, 319, 325; 328/63, 72; 307/480

[56] References Cited

U.S. PATENT DOCUMENTS

| | | | |
|---|---|---|---|
| 4,862,106 | 8/1989 | Toda et al. | 331/25 |
| 4,965,533 | 10/1990 | Gilmore | 331/18 |
| 5,036,298 | 7/1991 | Bulzachelli | 331/25 |

*Primary Examiner*—Stephen Chin
*Attorney, Agent, or Firm*—David R. Treacy

[57] ABSTRACT

A digital Phase Locked Loop (PLL) comprises a Voltage Controlled Oscillator (VCO) and a phase detector. The output of the VCO is coupled to a first input of the phase detector whose output is coupled to the input of the VCO by way of a low-pass filter. A second input of the phase detector is coupled to the output of a digital oscillator. The time constant of the low-pass filter determines the time necessary for the PLL to respond to frequency changes of the signal of the digital oscillator, and is therefore preferably made smallest possible. The lower boundary of the time constant is determined by the smallest possible frequency change of the digital oscillator signal. If the smallest possible frequency change is very small, the PLL will generally become too slow because the time constant is too large. By presenting a reference signal to the digital oscillator which reference signal is shifted by a predetermined phase magnitude by the digital oscillator in each time interval, a low-pass filter having a much smaller time constant may be sufficient.

20 Claims, 3 Drawing Sheets

DIGITAL PHASE LOCKED LOOP, AND DIGITAL OSCILLATOR ARRANGED TO BE USED IN THE DIGITAL PHASE LOCKED LOOP

BACKGROUND OF THE INVENTION

The invention relates to a digital Phase Locked Loop, comprising a Voltage Controlled Oscillator and a phase detector whose output is coupled to an input of the Voltage Controlled Oscillator through a low-pass filter, an output of the Voltage Controlled Oscillator being coupled to a first input of the phase detector whose second input is coupled to an output of a digital oscillator. The invention further relates to a digital oscillator arranged to be used in the digital Phase Locked Loop.

A digital Phase Locked Loop of this type is generally known. The digital oscillator used herein is arranged, for example, as a programmable pulse generator which is also widely known. A programmable pulse generator generates a signal in the form of a plurality of pulses per time unit, for example, 2 million pulses per second. The frequency of this signal is then 2 MHz and may be reduced in a simple manner by blocking one or more pulses per time unit.

When a digital oscillator of this type is used in the Phase Locked Loop (PLL), the signal of the digital oscillator is fed to the phase detector together with the output signal of the Voltage Controlled Oscillator (VCO). Through the low-pass filter the phase detector output signal which represents the phase difference between the two fed signals is presented to the input of the VCO. The time constant of the low-pass filter determines the time required by the PLL for reacting to the frequency changes of the signal of the digital oscillator and is therefore made as small as possible. The lower limit of the time constant is determined by the minimum frequency change of the signal of the digital oscillator. In some digital telephone exchanges a smallest possible frequency change of 1/64 Hz is demanded for a base frequency of 2 MHz with an accuracy of 100 ppm (200 Hz), which change corresponds to a variation of 1/64 pulse per second or a variation of 1 pulse per 64 seconds. The minimum required time constant is in this case 64 seconds, due to which the PLL then exhibits much too slow a reaction to frequency changes.

SUMMARY OF THE INVENTION

It is an object of the invention to provide a digital PLL in which a low-pass filter having a smaller time constant will suffice.

For this purpose, the digital PLL according to the invention is characterized in that the digital oscillator comprises a multiplexing shifter for shifting by a predetermined phase magnitude per time interval a reference signal presented to an input of the digital oscillator, and for generating an output signal at the output of the digital oscillator which output signal is the reference signal shifted by a predetermined phase magnitude per time interval.

If the reference signal is shifted by a specific phase magnitude in a positive phase direction per time interval, the output signal has a lower frequency than the reference signal. If, on the other hand, the reference signal is shifted by a specific phase magnitude in a negative phase direction per time interval, the output signal has a higher frequency than the reference signal. If the frequency of the reference signal is, for example, 2 MHz and this signal is shifted by 90° in a positive phase direction every microsecond, there is a positive phase shift of 360° every 4 microseconds, which corresponds to a negative frequency change of 250 kHz. In this case the frequency of the output signal is 1.75 MHz. However, if the reference signal is shifted by 90° in a negative phase direction every microsecond, there will be a negative phase shift of 360° every 4 microseconds, which corresponds to a positive frequency change of 250 kHz. In that case the frequency of the output signal is 2.25 MHz.

Because a frequency change is not obtained by blocking one or more pulses per time unit, as occurs with a digital oscillator arranged as a programmable pulse generator, but because a frequency change is realized by this digital oscillator by causing a phase shift to occur every time interval, the output signal of the digital oscillator obtains a more uniform character. When the digital oscillator is used in the PLL, a low-pass filter with a smaller time constant may suffice, the degree of time constant reduction then depending on the extent of the phase shift. If this shift is, for example, 90°, it will be sufficient to have a 4 times smaller time constant.

In a first embodiment of the digital PLL according to the invention the digital PLL is characterized, in that the multiplexing shifter of the digital oscillator is arranged for additionally phase-shifting the reference signal in the time interval by means of at least one phase pulse having a predetermined amplitude and situated in the time interval.

During this operation, the phase shift by the predetermined phase magnitude effected once per time interval is preceded by a phase pulse having a predetermined amplitude. The output signal of the oscillator is then better integrable, so that it will be sufficient for the PLL to comprise a low-pass filter having an even smaller time constant.

In a second embodiment of the digital PLL according to the invention the digital PLL is characterized in that the predetermined amplitude of the phase pulse is substantially equal to the predetermined phase magnitude.

By selecting the predetermined amplitude of the phase pulse to be equal to the predetermined phase magnitude, this embodiment becomes simple to realize.

In a third embodiment of the digital PLL according to the invention the digital PLL is characterized in that for the case where at least two phase pulses occur in a time interval, the pulse duration increases for each next phase pulse in that time interval.

In that case the output signal of the digital oscillator becomes highly integrable, so that it will be sufficient for the PLL to comprise a low-pass filter with a very small time constant.

In a fourth embodiment of the digital PLL according to the invention the digital PLL is characterized in that the digital oscillator further includes control means for generating a control signal whose duration corresponds to the time interval, these control means having an output coupled to a control input of the conveying means for conveying the control signal to the multiplexing shifter, a first phase shift occurring in response to a first control signal and a next phase shift occurring in response to a next control signal.

By permitting each phase shift to occur in response to a control signal whose duration corresponds to the time interval, the magnitude of the frequency change of the reference signal can be adjusted by adjusting the duration of the control signal by way of the control means, whereas the magnitude of the phase shifts remaining constant. If the duration of the control signal and thus the length of the time interval decreases, there will be more phase shifts per second and the frequency change will increase. If the duration of the control signal and thus the length of the time interval increases, there will be fewer phase shifts per second and the frequency change will decrease.

In a fifth embodiment of the digital PLL according to the invention the digital PLL is characterized in that the control means are arranged for temporarily generating the next control signal during the first control signal, the duration of the first control signal corresponding to the time interval and the duration of the next control signal corresponding to the pulse duration of the phase pulse.

Since in this PLL the next phase shift already temporarily occurs in the digital oscillator during the time interval situated between the first phase shift and the next phase shift, the output signal of the digital oscillator is better integrable as has already been described hereinbefore. The pulse duration of the phase pulse is then adjustable by varying the length of the next temporarily generated control signal.

In a sixth embodiment of the digital PLL according to the invention the digital PLL is characterized in that the control means comprise dividing means for dividing the time interval belonging to the first control signal into sub-intervals, for permitting the control means to temporarily generate the next control signal during these sub-intervals, the control signal duration increasing for each next sub-interval and having a maximum length equal to that of the sub-interval.

The output signal of the oscillator used in this PLL is highly integrable as has already been described hereinbefore. If the dividing means divide the time interval into, for example, 4 sub-intervals, while in the first interval the next phase shift does not occur, in the second sub-interval the next phase shift occurs during ¼ of this sub-interval, in the third sub-interval the next phase shift occurs during 2/4 of this sub-interval and in the fourth sub-interval the next phase shift occurs during ¾ of this sub-interval, it will be sufficient for the PLL to comprise a low-pass filter having a very small time constant when an oscillator of this type is used, even if a very small minimum frequency change of, for example, 1/64 Hz is possible.

In a seventh embodiment of the digital PLL according to the invention, the digital PLL is characterized in that the multiplexing shifter comprise a shift register and a multiplexer, an input of the shift register forming the input to the digital oscillator and outputs of the shift register being coupled to inputs of the multiplexer, and an output of the multiplexer forming the output of the digital oscillator.

This PLL has a very simple structure. If, for example, phase shifts of 90° each are desired, the shift register is to have 4 outputs at which the reference signal is available phase shifted by 0°, 90°, 180° and 270° respectively. Each output is coupled to a corresponding input of the multiplexer which each time couples one of its inputs to its output. At this output the reference signal phase shifted per time interval is then available.

In an eighth embodiment of the digital PLL according to the invention the digital PLL is characterized in that the control means comprise a first counter, a second counter and a comparator, least significant outputs of which first counter being coupled to a first input of the comparator, outputs of which second counter being coupled to a second input of the comparator, most significant outputs of which first counter together with a comparator output forming the output of the control means, this control means output being coupled to a control input of the multiplexer, the control input forming the control input of the multiplexing shifter and the first counter forming the dividing means.

The most significant outputs of the first counter generate the control signal in response to which the frequency shift occurs per time interval. The duration of this signal, which duration corresponds to the time interval, is thus determined by the cycle time of the least significant outputs. The number of possible counts present on the least significant outputs then correspond to the number of sub-intervals per time interval. The comparator decides whether this count is greater than the count present on the second counter for temporarily generating during the sub-intervals the next control signals of durations which increase for each sub-interval.

The invention will be further explained with reference to an exemplary embodiment shown in the drawing.

DESCRIPTION OF THE PREFERRED EMBODIMENT

Figure 1:
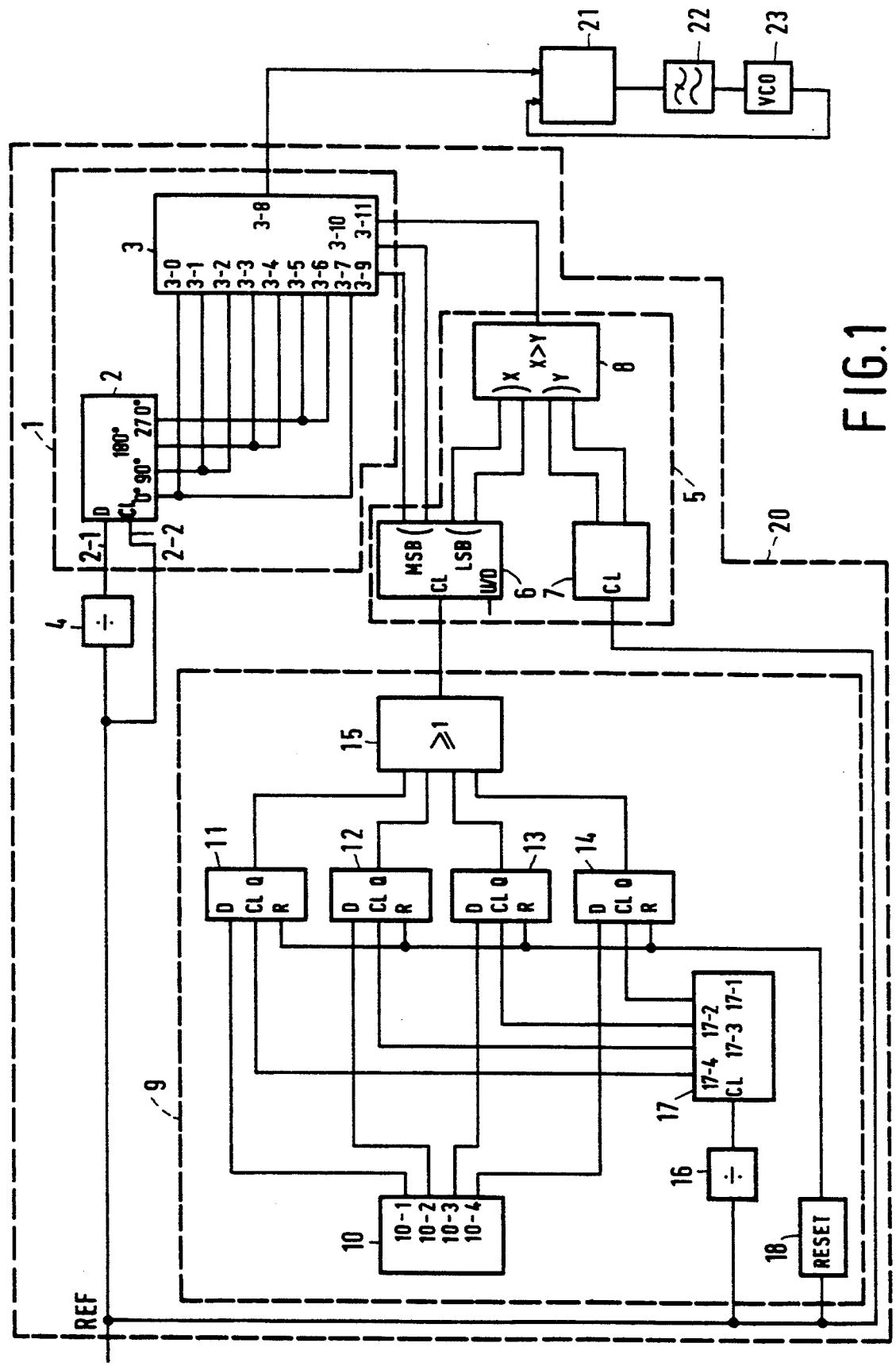
FIG. 1 shows the digital PLL according to the invention.

The digital PLL shown in FIG. 1 comprises a digital oscillator 20, a phase detector 21, a low-pass filter 22 and a Voltage Controlled Oscillator 23 (VCO). An output of VCO 23 is connected to a first input of phase detector 21 of which an output is connected to an input of VCO 23 via low-pass filter 22. An output of oscillator 20 is connected to a second input of phase detector 21. The oscillator 20 comprises a multiplexing shifter 1 which include a shift register 2 and a multiplexer 3. A data input 2-1 of shift register 2 forms an input of the multiplexing shifter 1 and receives through divider 4 a reference signal which is further applied directly to a clock input 2-2 of the shift register 2. This reference signal comes, for example, from a crystal (not shown) oscillating at a frequency of 8 MHz. When the divider 4 divides by a factor of four, data input 2-1 is supplied with a signal having a frequency of 2 MHz. The shift register 2 has four outputs at which the signal applied to the data input 2-1 is available phase shifted each time by 90°. A 0° output is connected to inputs 3-0 and 3-7 of the multiplexer 3, a 90° output is connected to the inputs 3-1 and 3-2, a 180° output is connected to the inputs 3-3 and 3-4 and a 270° output is connected to inputs 3-5 and 3-6. Output 3-8 of the multiplexer 3 forms an output of the multiplexing shifter 1 at which an output signal is available.

Further, multiplexer 3 has three control inputs 3-9, 3-10 and 3-11 which together form one control input of multiplexing shifter 1. The coupling of the outputs of the shift register 2 to the inputs of the multiplexer 3 is such that control signals sent to control inputs 3-9 and 3-10 decide which output of the shift register 2 is coupled to the output of the multiplexing shifter 1. By way of the control signal to control input 3-11 a next output of the shift register may then be (temporarily) coupled through. In principle, by way of control signals to the control inputs 3-9 and 3-10, it is determined which of the inputs 3-0, 3-2, 3-4 or 3-6 is connected to the output 3-8 and by way of a control signal to control input 3-11; and whether the input 3-1 is to be connected in lieu of input 3-0, or the input 3-3 in lieu of input 3-2, or the input 3-5 in lieu of input 3-4, or the input 3-7 in lieu of input 3-6. This actually means that the 90° phase jump is realized per time interval by the control signals sent to the control input 3-9 and 3-10, whereas the temporary additional 90° phase jump (phase pulse in this case with a 90° amplitude) is realized during the time interval by way of a control signal to control input 3-11.

These control signals are generated by control means 5 comprising a first counter 6, a second counter 7 and a comparator 8. Counter 6 has four outputs. The most significant outputs are coupled to control input 3-9 and 3-10 of the multiplexer 3 while the two least significant outputs are coupled to a first input of the comparator 8. Counter 7 has two outputs which are coupled to a second input of comparator 8. The output of comparator 8 is coupled to control input 3-11. A clock input of counter 7 receives the reference signal and a clock input of counter 6 is coupled to an output of a programmable pulse generator 9.

This programmable pulse generator 9 comprises a buffer 10 having four outputs for adjusting and storing a specific data word available at the outputs. The first, least significant output 10-1 of the buffer is coupled to a data input of a D-flipflop (DFF) 11, the second output 10-2 is coupled to a data input of DFF 12, the third output 10-3 is coupled to a data input of DFF 13 and a fourth, most significant output 10-4 is coupled to a data input of DFF 14. Outputs of the DFFs 11, 12, 13 and 14 are coupled to the inputs of OR gate 15, an output of OR gate 15 forming an output of the control means and being coupled to a clock input of the counter 6. Pulse generator 9 further includes a divider 16 and a counter 17. The first, least significant output 17-1 of this counter is coupled to a clock input of DFF 14, the second output 17-2 is coupled to a clock input of DFF 13, the third output 17-3 is coupled to a clock input of DFF 12 and the fourth, most significant output 17-4 of counter 17 is coupled to a clock input of DFF 11. Reset inputs of the DFFs 11, 12, 13 and 14 are coupled to a reset circuit 18 which, as does divider 16, receives the reference signal. An output of divider 16 is coupled to a clock input of counter 17.

The operation of the digital oscillator 20, which comprises the multiplexing shifter 1, the control means 5 and the programmable pulse generator 9 is as follows. The pulse generator 9 generates a signal with an adjustable frequency, for example, 1 MHz. This signal is applied to the clock input of counter 6, in response to which this counter 6 counts with a frequency of 1 MHz and increments its count by unity every microsecond. The cycle time of the two least significant outputs of counter 6 is then four microseconds, which implies that the count of the two most significant outputs of counter 6 is incremented by unity every four microseconds. In response to this, the multiplexer 3 couples a next output of the shift register 2 every four microseconds, a 90° phase shift being realized in the output signal every four microseconds. Every sixteen microseconds the phase shift is then 360°, which corresponds to a frequency change of 62.5 kHz. For a signal having a frequency of 2 MHz and applied to data input 2-1, an output signal of 1.9375 MHz will appear at output 3-8.

Figure 2:
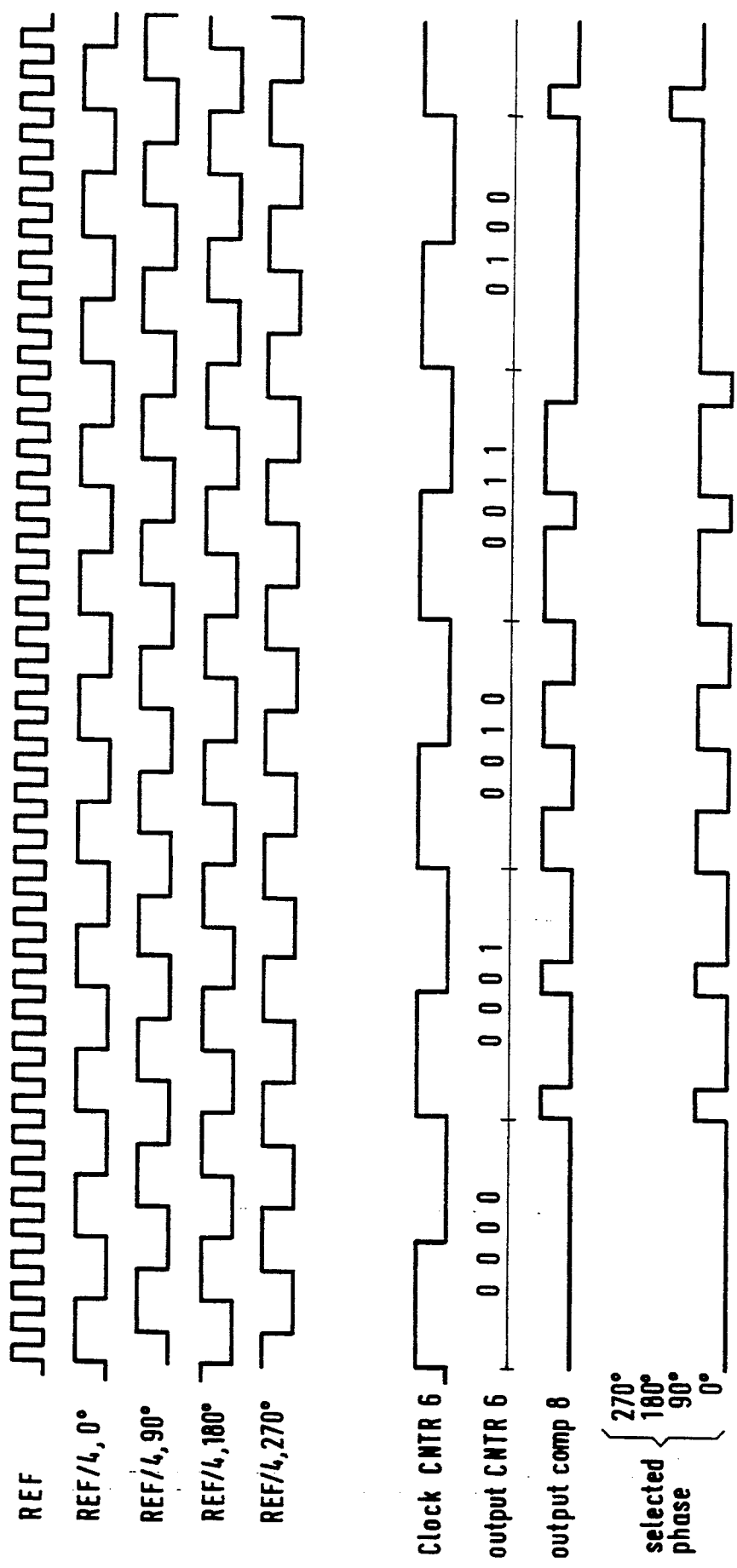
FIG. 2 shows a time diagram of the signals available in the digital oscillator.

The time diagram shown in FIG. 2 illustrates the operation of the oscillator 20 at signal level. It is again assumed that the frequency of the reference signal is 8 MHz and that the pulse generator 9 generates a signal with a frequency of 1 MHz, which signal is applied to the clock input of counter 6. Counter 6 thus counts with a frequency of 1 MHz from 0 (0000) to 15 (1111) and increments its count by unity every microsecond. Counter 7 counts with a frequency of 8 MHz from 0 (00) to 3 (11) and increments its count by unity every $\frac{1}{8}$ microsecond.

The count of counter 6 is 0000 during a first microsecond. Both most significant outputs as well as at least significant outputs have the logic value "zero". Comparator 8 compares to find whether the count on both least significant outputs is greater than the count of counter 7 which counts two complete cycles during this first microsecond. Since the value 00 is never greater than the count of counter 7, comparator 8 generates a signal having the logic value "zero" for this first microsecond. The three control inputs 3-9, 3-10 and 3-11 of multiplexer 3 receive control signals having the logic value "zero", in response to which input 3-0 is coupled to output 3-8 for this first microsecond. The output signal is then the reference signal divided by four and not phase-shifted (or phase-shifted by 0°).

The count of counter 6 is 0001 during a second microsecond. Comparator 8 compares the count (01) on both least significant outputs with the count of counter 7. If the count is 00, the count on both least significant outputs is greater and comparator 8 will generate a signal having the logic value "one". During this second microsecond, comparator 8 will thus generate a signal of the logic value "one" twice, each time for $\frac{1}{8}$ microsecond (the duration of each count on counter 7). Control input 3-11 is supplied with this signal in response to which input 3-1 instead of input 3-0 is coupled to output 3-8 twice during this second microsecond, each time for $\frac{1}{8}$ microsecond, while the output signal is then the reference signal phase-shifted by 90° and divided by four, in lieu of the reference signal (divided by four) which is not phase-shifted.

The count of counter 6 is 0010 during a third microsecond. The count (10) on both least significant outputs is greater than the counts 00 and 01 of counter 7 and during this third microsecond comparator 8 will thus generate a signal of a logic value "one" twice, each time for 2/8 microsecond. Control input 3-11 is supplied with this signal in response to which input 3-1 in lieu of input 3-0 is coupled to output 3-8 twice during this third microsecond, each time for 2/8 microsecond, while the output signal is then the reference signal phase-shifted by 90° and divided by four in lieu of the reference signal (divided by four) which is not phase-shifted.

The count of counter 6 is 0011 during a fourth microsecond. The count (11) on both least significant outputs is greater than the counts 00, 01 and 10 of counter 7, and during this fourth microsecond comparator 8 will thus generate a signal having a logic value "one" twice, each time for 3/8 microsecond. Control input 3-11 is supplied with this signal in response to which input 3-1 in lieu of input 3-0 is coupled to output 3-8 twice during this fourth microsecond, each time for 3/8 microsecond, while the output signal is then the reference signal phase-shifted by 90° and divided by four, in lieu of the reference signal (divided by four) which is not phase-shifted.

The count of counter 6 is 0100 during a fifth microsecond. The count on both most significant outputs (01) is applied to the control inputs 3-9 and 3-10 in response to which input 3-2 is coupled to output 3-8. During this fifth microsecond the output signal is then constantly the reference signal phase-shifted by 90° and divided by four, because the count on both least significant outputs (00) is never greater than the count of counter 7, and comparator 8 thus constantly generates during this fifth microsecond a signal having a logic value "zero".

During a sixth microsecond comparator 8 again generates a signal having a logic value "one" twice, each time with a duration of ⅛ microsecond. Clock input 3-11 is supplied with this signal in response to which input 3-3 in lieu of input 3-2 is coupled to the output 3-8 twice during this sixth microsecond, each time for ⅛ microsecond, the output signal then being the reference signal phase-shifted by 180° and divided by four in lieu of the reference signal phase-shifted by 90° (divided by four), and so on.

Figure 3:
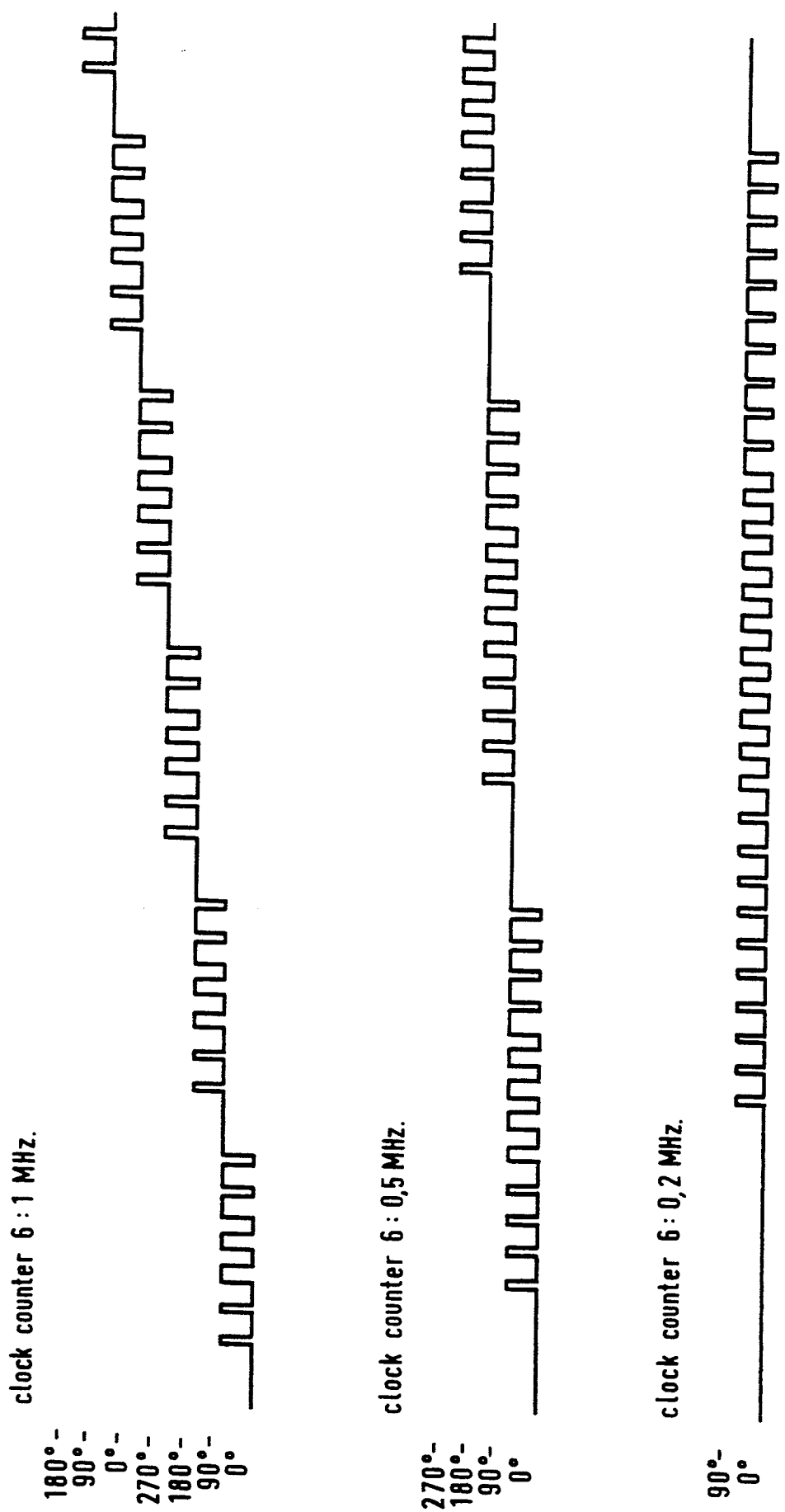
FIG. 3 shows examples of reference signal phase shifts for different pulse generator frequencies.

FIG. 3 shows the aforementioned over a larger time interval for signals generated by the programmable pulse generator 9 with a frequency of 1 MHz, 0.5 MHz and 0.2 MHz. In the first case the output frequency is 1.9375 MHz as has already been calculated hereinbefore. For the second and third cases the output frequency may be similarly calculated to be 1.96875 MHz and 1.9875 MHz respectively.

With the aid of the programmable pulse generator 9 represented in FIG. 1 an adjustable frequency pulse signal is generated. This frequency is adjusted by means of the data word stored in buffer 10. If this data word is, for example, 0001, only DFF 11 out of the DFFs 11, 12, 13 and 14 receives at its data input a signal having the logic value "one". For example, if the dividend of divider 16 is, for example, four, counter 17 is supplied with a clock signal having a frequency of 2 MHz and will then increment its count by unity every 0.5 microsecond. The fourth, most significant output 17-4 of counter 17, connected to the clock input of DFF 11, then alternately has the values "zero" and "one" for 4 microseconds. During a complete 8-microsecond-long cycle period of counter 17, DFF 11, which is of the edge-triggered type, receives in this case one clock pulse in 8 microseconds. Because the data input of DFF 11 is supplied with a signal having the logic value "one", DFF 11 will generate one output pulse in 8 microseconds in response to the clock pulse, which output pulse also appears at the output of pulse generator 9 through OR gate 15. Pulse generator 9 thus generates an output signal having a frequency of ⅛ MHz.

If the data word in buffer 10 is 0010, the data input of DFF 12 is supplied with a signal having the logic value "one". The third output 17-3 of counter 17, which is connected to the clock input of DFF 12, has the value "zero" for 2 microseconds and the value "one" for the next two microseconds. DFF 12 is then supplied with two clock pulses in 8 microseconds and generates two output pulses in 8 microseconds. Pulse generator 9 then generates an output signal having a frequency of 2/8=¼ MHz.

If the data word in buffer 10 is, for example, 0011, the data inputs of both DFF 11 and DFF 12 are supplied with signals having the logic value "one". Because DFF 11 is supplied with one and DFF 12 with two pulses in 8 microseconds, and these pulses do not coincide, the pulse generator 9 will generate three output pulses in 8 microseconds. The frequency of this output signal is then ⅜ MHz, and so on.

In the case of a data word 1111 in buffer 10, the data inputs of all the DFFs 11, 12, 13 and 14 are supplied with the logic value "one" and their clock inputs with 15 non-coinciding pulses in 8 microseconds coming from the counter 17. Pulse generator 9 will then generate 15 output pulses in 8 microseconds which corresponds to an output signal having a frequency of 15/8 MHz.

In this manner a signal can be generated with the pulse generator 9 with a frequency which is adjustable in steps between ⅛ MHz and 15/8 MHz. This signal is applied to counter 6 and causes, as has already been described, a frequency change to occur in the output signal of the digital oscillator 20. Thus, the output frequency of the digital oscillator 20 may be adjusted by a choice of a specific data word from buffer 10.

If it generally holds that:

$F_{PPG}$ is the frequency of the output signal of the programmable pulse generator 9, $F_{REF}$ is the frequency of the reference signal, $D_1$ is the dividend of the divider 16, N is the number of outputs of counter 17 and K is the value of data word in buffer 10, for $F_{PPG}$ there may be simply found that:

$$F_{PPG} = \frac{F_{REF} \times K}{2^N \times D_1}$$

The minimum desired frequency step $F_{STEPMIN}$ in the output signal of the programmable pulse generator 9 affects the magnitude of N. Generally, the following is to hold for N:

$$\frac{F_{REF}}{2^N \times D_1} \leq F_{STEPMIN} < \frac{F_{REF}}{2^{N-1} \times D_1}$$

The maximum desired frequency $F_{PPGMAX}$ of the output signal of the programmable pulse generator 9 affects the magnitude of $D_1$. Generally, the following is to hold for $D_1$:

$$\frac{F_{REF}}{D_1 + 1} < F_{PPGMAX} \leq \frac{F_{REF}}{D_1}$$

If it generally holds that:

$F_{OUT}$ is the output frequency of the digital oscillator 20, $D_2$ is the dividend of the divider 4, P is the number of outputs of the counter 7 and P+2 is the number of outputs of the counter 6, there may simply be found for $F_{OUT}$ that:

$$F_{OUT} = \frac{F_{REF}}{D_2} - \frac{F_{PPG}}{2^{P+2}}$$

If the digital oscillator 20 is used in the PLL, the time constant of the low-pass filter 22 is to be greater than $$\frac{1}{F_{STEPMIN} \times 2^{2(P+2)}}$$

and greater than $$\frac{2^P}{F_{REF}}$$

The optimum value for P (the number of outputs of counter 7) may be calculated from this in a simple manner:

$$P = \frac{\log \sqrt{F_{REF}} - \log \sqrt{4 \times F_{STEPMIN} \times 2^{P+2}}}{\log 2}$$

With this optimum value for P the jitter frequency $F_{JITTER}$ is:

$$F_{JITTER} = 2 \times \sqrt{F_{REF} \times F_{STEPMIN} \times 2^{P+2}}$$

digital oscillator 20. Since this jitter frequency $F_{JITTER}$ is extremely high, even for a small value for $F_{STEPMIN}$, it will generally be sufficient for this PLL to include a simple and fast low-pass filter 22.

In this manner it is possible to generate an output frequency $F_{OUT}$ by means of the digital oscillator 20, for which frequency holds: $F_{OUT} < F_{REF}/D_2$. By permitting counter 6 to have an Up/Down input, due to which the counter 6 is enabled to decrement its count by a value "one" in addition to incrementing its count by the value "one", it is possible to permit the oscillator 20 also to generate an output frequency $F_{OUT}$ for which holds: $F_{OUT} > F_{REF}D_2$. For example, if a processor produces the data word for buffer 10, depending on specific measurement results, this processor may also trigger the Up/Down input of counter 6.

I claim:

1. A digital phase locked loop, comprising a voltage controlled oscillator, a digital oscillator, a low-pass filter and a phase detector having first and second inputs and an output; the phase detector output being coupled to an input of the voltage controlled oscillator through said low-pass filter, an output of the voltage controlled oscillator being coupled to the first input of the phase detector, and an output of the digital oscillator being coupled to the second input of the phase detector,
   characterized in that the digital oscillator comprises means for receiving a reference signal, and
   multiplexing shifter means for receiving and shifting said reference signal by a predetermined phase magnitude per time interval, and for generating an output signal which is the reference signal shifted by a predetermined phase magnitude per time interval,
   said multiplexing shifter means comprising a shifter circuit providing a plurality of shifter output signals having the frequency of said reference signal and having a phase respectively differing from each other by said predetermined phase magnitude; and a multiplexer having a plurality of multiplexer inputs respectively connected to said shifter outputs, for selecting a respective one of said multiplexer inputs to be said output signal for a time related to said time interval.

2. A digital phase locked loop as claimed in claim 1, characterized in that the multiplexing shifter means comprises means for additionally phase-shifting said reference signal at least one phase pulse having a predetermined amplitude during a said time interval.

3. A digital phase locked loop as claimed in claim 2, characterized in that the predetermined amplitude of the phase pulse is substantially equal to the predetermined phase magnitude.

4. A digital phase locked loop as claimed in claim 3, characterized in that for the case where at least two phase pulses occur in a time interval, the pulse duration increases for each next phase pulse in that time interval.

5. A digital phase locked loop, comprising a voltage controlled oscillator, a digital oscillator, a low-pass filter and a phase detector having first and second inputs and an output; the phase detector output being coupled to an input of the voltage controlled oscillator through said low-pass filter, an output of the voltage controlled oscillator being coupled to the first input of the phase detector, and an output of the digital oscillator being coupled to the second input of the phase detector,
   characterized in that the digital oscillator comprises means for receiving a reference signal, and
   multiplexing shifter means for receiving and shifting said reference signal by a predetermined phase magnitude per time interval, and for generating an output signal which is the reference signal shifted by a predetermined phase magnitude per time interval,
   said multiplexing shifter means comprises means for additionally phase-shifting said reference signal at least one phase pulse, having a predetermined amplitude substantially equal to said predetermined phase magnitude, during a said time interval; and for the case where at least two phase pulses occur in a time interval, the pulse duration increases for each next phase pulse in that time interval, and
   the digital oscillator further includes control means for generating a control signal whose duration corresponds to the time interval, and conveying means for conveying the control signal to said multiplexing shifter means, said control means having an output coupled to a control input of the conveying means, a first phase shift occurring in response to a first control signal and a next phase shift occurring in response to a next control signal.

6. A digital phase locked loop as claimed in claim 5, characterized in that the control means are arranged for temporarily generating the next control signal during the first control signal, the duration of the first control signal corresponding to the time interval and the duration of the next control signal corresponding to the pulse duration of the phase pulse.

7. A digital phase locked loop as claimed in claim 6, characterized in that the control means comprise dividing means for dividing the time interval belonging to the first control signal into sub-intervals, for permitting the control means to temporarily generate the next control signal during these sub-intervals, the control signal duration increasing for each next sub-interval and having a maximum length equal to that of the sub-interval.

8. A digital phase locked loop as claimed in claim 7, characterized in that the multiplexing shifter means comprise a shift register and a multiplexer, an input of the shift register forming the input to the digital oscillator and outputs of the shift register being coupled to inputs of the multiplexer, and an output of the multiplexer forming the output of the digital oscillator.

9. A digital phase locked loop as claimed in claim 8, characterized in that the control means comprise a first counter, a second counter and a comparator, least significant outputs of said first counter are coupled to a first input of the comparator, outputs of said second counter being coupled to a second input of the comparator, and most significant outputs of said first counter together with a comparator output form the output of the control means, this control means output being coupled to a control input of the multiplexer, the control input forming the control input of the multiplexing shifter means and the first counter forming the dividing means.

10. A phase locked loop as claimed in claim 1, characterized in that said means for receiving comprises means for receiving a higher frequency signal, and means for dividing said higher frequency signal to form said reference signal, and said predetermined phase magnitude corresponds to one period of said higher frequency.

11. A digital oscillator, for use in a digital phase locked loop, comprising means for receiving a reference signal, and multiplexing shifter means for receiving and shifting said reference signal by a predetermined phase magnitude per time interval, and for generating an output signal which is the reference signal shifted by a predetermined phase magnitude per time interval, said multiplexing shifter means comprising a shifter circuit providing a plurality of shifter output signals having the frequency of said reference signal and having a phase respectively differing from each other by said predetermined phase magnitude; and a multiplexer having a plurality of multiplexer inputs respectively connected to said shifter outputs, for selecting a respective one of said multiplexer inputs to be said output signal for a time related to said time interval.

12. A digital oscillator as claimed in claim 11, characterized in that the multiplexing shifter means comprises means for additionally phase-shifting said reference signal at least one phase pulse having a predetermined amplitude during a said time interval.

13. A digital oscillator as claimed in claim 12, characterized in that the predetermined amplitude of the phase pulse is substantially equal to the predetermined phase magnitude.

14. A digital oscillator as claimed in claim 13, characterized in that for the case where at least two phase pulses occur in a time interval, the pulse duration increases for each next phase pulse in that time interval.

15. A digital oscillator, for use in a digital phase locked loop, comprising means for receiving a reference signal, and multiplexing shifter means for receiving and shifting said reference signal by a predetermined phase magnitude per time interval, and for generating an output signal which is the reference signal shifted by a predetermined phase magnitude per time interval, characterized in that the digital oscillator further includes control means for generating a control signal whose duration corresponds to the time interval, and conveying means for conveying the control signal to said multiplexing shifter means, said control means having an output coupled to a control input of the conveying means, a first phase shift occurring in response to a first control signal and a next phase shift occurring in response to a next control signal.

16. A digital oscillator as claimed in claim 15, characterized in that the control means are arranged for temporarily generating the next control signal during the first control signal, the duration of the first control signal corresponding to the time interval and the duration of the next control signal corresponding to the pulse duration of the phase pulse.

17. A digital oscillator as claimed in claim 16, characterized in that the control means comprise dividing means for dividing the time interval belonging to the first control signal into sub-intervals, for permitting the control means to temporarily generate the next control signal during theses sub-intervals, the control signal duration increasing for each next sub-interval and having maximum length equal to that of the sub-interval.

18. A digital oscillator as claimed in claim 17, characterized in that the multiplexing shifter means comprise a shift register and a multiplexer, an input of the shift register forming the input to the digital oscillator and outputs of the shift register being coupled to inputs of the multiplexer, and an output of the multiplexer forming the output of the digital oscillator.

19. A digital oscillator as claimed in claim 18, characterized in that the control means comprise a first counter, a second counter and a comparator, least significant outputs of said first counter are coupled to a first input of the comparator, outputs of said second counter being coupled to a second input of the comparator, and most significant outputs of said first counter together with a comparator output form the output of the control means, this control means output being coupled to a control input of the multiplexer, the control input forming the control input of the multiplexing shifter means and the first counter forming the dividing means.

20. A digital oscillator as claimed in claim 11, characterized in that said means for receiving comprises means for receiving a higher frequency signal, and means for dividing said higher frequency signal to form said reference signal, and said predetermined phase magnitude corresponds to one period of said higher frequency.

* * * * *